(12) United States Patent
Chen et al.

(10) Patent No.: US 11,061,073 B2
(45) Date of Patent: *Jul. 13, 2021

(54) CIRCUIT TESTING SYSTEM AND CIRCUIT TESTING METHOD

(71) Applicant: Realtek Semiconductor Corporation, Hsinchu (TW)

(72) Inventors: Ying-Yen Chen, Hsinchu (TW); Jeong-Fa Sheu, Taoyuan (TW); Chia-Jui Yang, Taipei (TW); Po-Lin Chen, Chiayi County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/701,609

(22) Filed: Dec. 3, 2019

(65) Prior Publication Data
US 2020/0217887 A1    Jul. 9, 2020

(30) Foreign Application Priority Data
Jan. 9, 2019 (TW) .................................. 108100893

(51) Int. Cl.
*G01R 31/28* (2006.01)
*G01R 31/3177* (2006.01)
*G06F 13/40* (2006.01)

(52) U.S. Cl.
CPC ..... *G01R 31/3177* (2013.01); *G06F 13/4068* (2013.01)

(58) Field of Classification Search
CPC .......................... G01R 31/3177; G06F 13/4068
See application file for complete search history.

(56) References Cited

U.S. PATENT DOCUMENTS

| 2014/0047293 A1* | 2/2014 | Lamb ..................... G01R 31/27 714/727 |
| 2019/0108093 A1 | 4/2019 | Presman et al. |
| 2019/0229844 A1 | 7/2019 | Coulombe et al. |

FOREIGN PATENT DOCUMENTS

| TW | 201710699 A | 3/2017 |
| TW | 201710701 A | 3/2017 |

OTHER PUBLICATIONS

Cortez,Mafalda et al., Testing Methods for PUF-Based Security Key Storage Circuits; Journal of electronic testing, 2014, vol. 30(5), p. 581-594.

* cited by examiner

*Primary Examiner* — Samir W Rizk
(74) *Attorney, Agent, or Firm* — Locke Lord LLP; Tim Tingkang Xia, Esq.

(57) ABSTRACT

The present disclosure relates to a circuit testing system, including a control circuit and an interface circuit. The control circuit is electrically connected to a test machine, and configured to receive a scan control signal. The I/O interface circuit is electrically connected to the control circuit, the test machine, the scan chain circuit and a circuit under test. When the scan control signal is at a first level, the control circuit is configured to control the I/O interface circuit to conduct the scan chain circuit to the test machine. When the scan control signal is at a second level, the control circuit is configured to control the I/O interface circuit to conduct the circuit under test to the test machine so as to propagate a response signal generated by the circuit under test to the test machine.

20 Claims, 10 Drawing Sheets

CIRCUIT TESTING SYSTEM AND CIRCUIT TESTING METHOD

CROSS-REFERENCE TO RELATED APPLICATION

This application claims priority to Taiwan Application Serial Number 108100893, filed Jan. 9, 2019, which is herein incorporated by reference in its entirety.

BACKGROUND

Technical Field

The present disclosure relates to a circuit testing system. More particularly, it refers to a technique that can receive a test signal from a test machine to determine whether a circuit under test is unusual.

Description of Related Art

Scan Chain is an implementation of Design for Testability (DFT). It detects each area of an integrated circuit by configuring multiple registers in the integrated circuit and determines whether the operation of the integrated circuit is unusual.

As the complexity of microchip design increases, it is increasingly important to detect the potential error of the wafer through the scan chain method. However, the technology of the scan chain is unable to test all areas of the integrated circuit, so it still needs to be improved. When detecting a combinational logic, which is between a register and an I/O Interface, the traditional scan chain testing techniques need to add wrappers in order to increase the test coverage, but this method is not ideal, some real circuit operation wiring and input/output interfaces still can not be fully and effectively tested.

SUMMARY

One aspect of the present disclosure is a circuit testing system, including a control circuit and an I/O interface circuit. The control circuit is electrically connected to a test machine, and configured to receive a scan control signal. The I/O interface circuit is electrically connected to the control circuit, the test machine, the scan chain circuit and a circuit under test. When the scan control signal is at a first level, the control circuit is configured to control the I/O interface circuit to conduct the scan chain circuit to receive scan patterns from the test machine. When the scan control signal is at a second level, the control circuit is configured to control the I/O interface circuit to conduct the circuit under test to the test machine so as to propagate a response signal generated by the circuit under test to the test machine.

Another aspect of the present disclosure is a circuit testing method, including the following steps: Receiving a scan control signal from a test machine by a control circuit. Controlling, by the control circuit, the I/O interface circuit to conduct the test machine to a scan chain circuit when the scan control signal is at a first level in order to propagate a scan test signal generated and sended from the test machine to the scan chain circuit. Controlling, by the control circuit, the I/O interface circuit to conduct a circuit under test to the test machine when the scan control signal is at a second level in order to propagate a response signal generated by the circuit under test to the test machine.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected to" or "coupled to", it can be directly connected or coupled to the other element or intervening elements may be present. In contrast, when an element to another element is referred to as being "directly connected" or "directly coupled," there are no intervening elements present. As used herein, the term "and/or" includes an associated listed items or any and all combinations of more.

Figure 1:
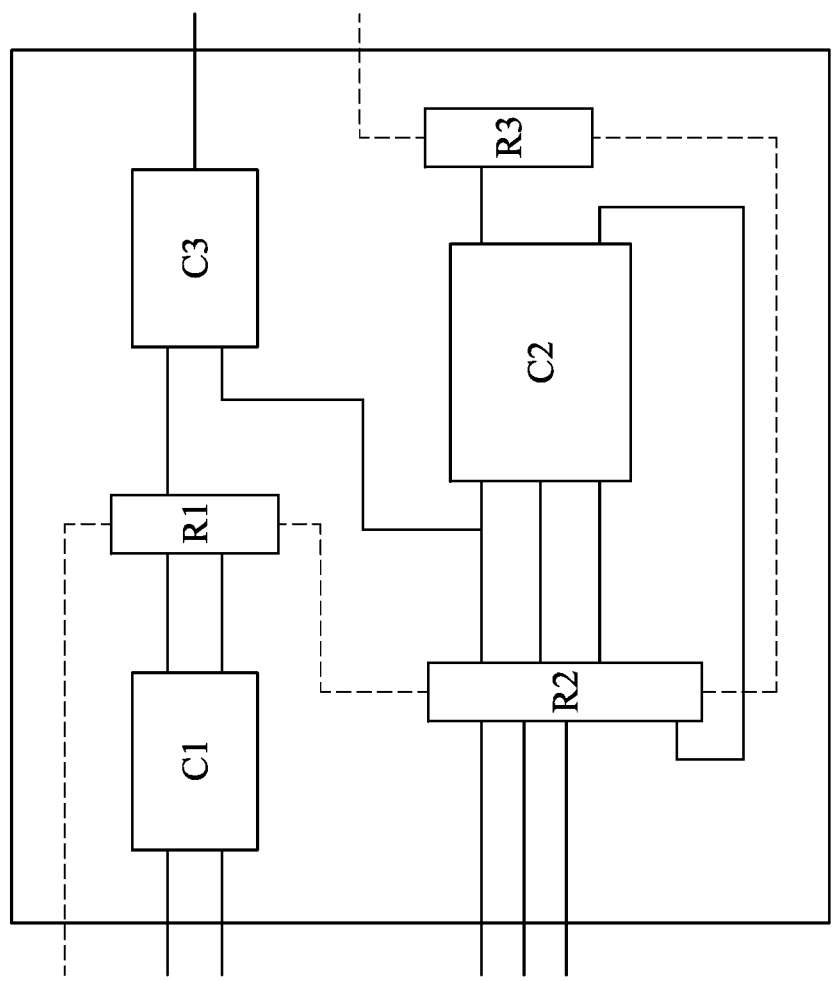
FIG. 1 is a schematic diagram of a microchip applied by the present disclosure.

The present disclosure relates to a circuit testing system and a circuit testing method. Referring to FIG. 1, FIG. 1 is a schematic diagram of a microchip applied by the present disclosure. In some embodiments, the circuit testing method of the present disclosure is applied to detect circuit of the microchip. As shown in FIG. 1, the microchip includes a plurality of circuit under tests C1 to C3 and a plurality of scan units R1-R3. The scan chain method detects some of the circuits in the microchip. The present disclosure may improve the detection coverage.

When performing the scan test by the scan chain test method, the detect process of the scan test includes a shift mode and a capture mode. In the shift mode, a test machine inputs a scan test signal to registers of the scan units R1-R3 one by one according to a clock signal generated by the test machine. This process that inputs signal with the clock signal is called "Shift", as shown by the dotted line in the figure. In the capture mode, the test machine stops outputting the clock signal first, then lets the circuit under test C1-C3 performing operation after the signal of the register is outputted to the circuit under test C1-C3 (as shown in the solid line path in the figure). Next, the test machine further generates and sends out the clock signal, so that the circuit under test C1-C3 outputs the operation result to the register of the scan units R1-R3. This process that outputs the operation result to the scan units R1-R3 is called "Capture".

As mention above, when performing the shift mode again, the test machine outputs the continuous clock signal again. At the same time, inputting new scan test patterns to the register of the scan units R1-R3 one by one. In the same time, the operation results in the registers of the scan units R1-R3 are also outputted to the test machine with the clock signals in order to determine whether the operation results matches the expected results. However, the above scan test is unable fully to detect all of the circuit under tests C1-C3. As shown in FIG. 1, since both of the input terminal of the circuit under test C1 and the output terminal of the circuit under test C3 are not connected to the scan unit consisting of a register and a multiplexer, the circuit under test C1, C3 is unable to detect by the scan chain test method. The traditional scan chain test inserts scan wrappers on the input terminals of the circuit under test C1 and the output terminals of the circuit under test C3 to improve the test coverage of the circuit under test C1 and C3. The operation of the scan wrapper is that changing the circuit wiring conduction between the normal functional circuit under test C1, C3 and the I/O interface circuit through the multiplexer in the scan mode. The circuit conduction is logically connected to some registers which are controllable under scan mode. Therefore, this improved method is unable to apply to cover all of normal functional circuit, and is unable to resolve problems that the internal circuits of the I/O interface are not completely test.

Figure 2:
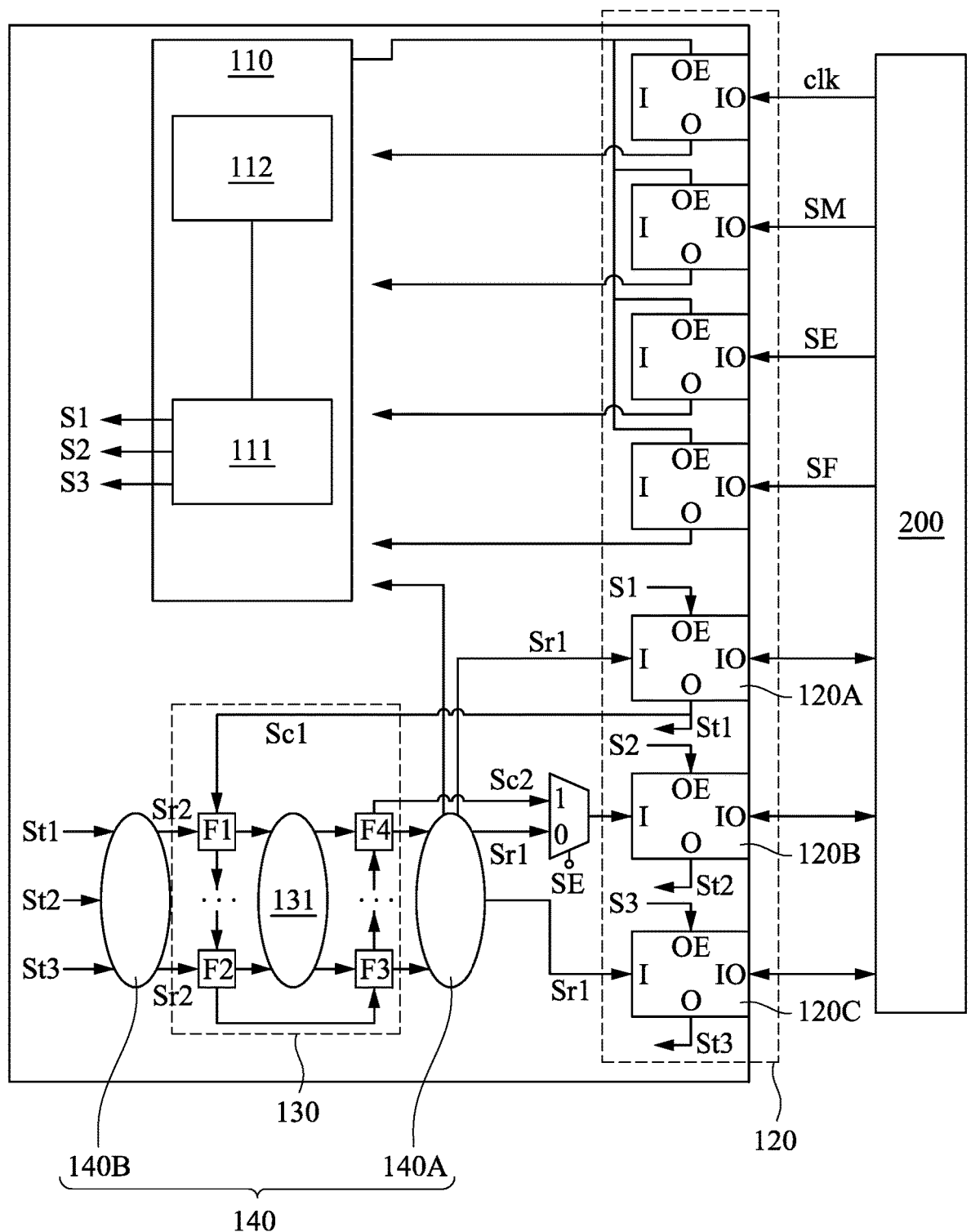
FIG. 2 is a schematic diagram of a circuit testing system in some embodiments of the present disclosure.

The present disclosure is able to improve the coverage of the scan chain test. Referring to FIG. 2, FIG. 2 is a schematic diagram of a circuit testing system in some embodiments of the present disclosure. The circuit testing system 100 includes a test machine 200, a control circuit 110, an I/O interface circuit 120, a scan chain circuit 130 and a circuit under test 140. The control circuit 110 is electrically connected to the test machine 200 through the I/O interface circuit 120 in order to receive a scan control signal SE, a scan auxiliary signal SF, a clock signal clk and a scan mode signal SM. FIG. 2 is just a schematic diagram of the present disclosure, wherein the scan chain circuit 130 may include multiple scan chains and multiple scan clocks. The scan control signal SE is one control signal of the scan test, details will be described in the subsequent paragraphs.

The I/O interface circuit 120 includes multiple input and output units, which are electrically connected to the control circuit 110, the test machine 200, the scan chain circuit 130 and the circuit under test 140. As shown in FIG. 2, in some embodiments, the I/O interface circuit 120 at least includes a first input and output unit 120A, a second input and output unit 120B and a third input and output unit 120C. Each of the input and output units may respectively includes multiple input and output units. The circuit under test 140 may be regarded as the circuit under test C1, C3 in FIG. 1. In the integrated circuits of the microchip, the integrated circuits are interrelated. Therefore, although the circuit under test 140 in FIG. 2 includes a first subcircuit 140A and a second subcircuit 140B, the drawing is only for the convenience of explaining the technology of the present case. It is not limited to the first subcircuit 140A and the second subcircuit 140B are completely independent circuits.

In some embodiments, the control circuit 110 receives the scan control signal SE through the I/O interface circuit 120. The I/O interface circuit 120 is a transmission interface between the microchip and external circuit. In some embodiments, the scan chain circuit 130 is the internal circuit of the above microchip configured to perform detection through the scan chain test method (it may be regarded as the scan units R1-R3 and the circuit under test C2 in FIG. 1).

In order to clarify the application of the present disclosure, the method that the circuit testing system 100 detects the scan chain circuit 130 by the scan chain test method is explained hereafter. In some embodiments, the scan chain circuit 130 includes a combinational 131 and multiple scan units F1-F4 electrically connected in series. The combinational 131 may include multiple detect areas. Each of the detect areas respectively corresponds to one of the scan units F1-F4. Each of the scan units F1-F4 includes a register and a multiplexer. The select terminal of the multiplexer receives a scan control signal SE, so that the register selectively receives the output signal from the combinational 131 or the previous scan unit.

When the scan control signal SE is at the first level (e.g., enable level), the scan control signal SE control the scan chain circuit 130 to the shift mode. At this time, through the first input and output unit 120A of the I/O interface circuit 120 and continuous scan clock signal, the test machine 200 inputs the different scan test signals Sc1 (e.g., 0 or 1) to the scan unit F1-F4 of the scan chain circuit 130 according to the clock period. The multiplexer of the scan unit F1-F4 inputs the scan test signal Sc1 to the register, and the multiplexer of the scan unit F1-F4 chooses to receive the output signal of the previous scan unit, therefore, the register of the scan units F1-F4 will form a serial circuit structure.

When the scan control signal SE is at the second level (e.g., disable level), the scan control signal SE control the scan chain circuit 130 to the capture mode. At this time, the test machine 200 stops outputting the scan clock signal, so that the multiplexer of the scan unit F1-F4 will not receive the scan test signal Sc1, but propagates the previously received scan test signal Sc1 to the combinational 131 to operate. Next, the test machine 200 returns to output a clock pulse. Since the multiplexer of the scan unit F1-F4 changes to choose to receive the operation result of the combinational 131 and the second subcircuit 140B (e.g., the second response signal Sr2 as shown in FIG. 2) according to scan control signal SE in this time. Accordingly, the register of the scan units F1-F4 will form a circuit structure configured to capture the combinational 131 and the second response signal Sr2 in order to capture the output signal of the combinational 131 and the second response signal Sr2.

When the scan control signal SE returns to the first level again from the second level (i.e., at the shift mode again), the scan unit F1-F4 receives the scan test signal Sc1 again. As shown in FIG. 2, the scan unit F4 propagates the received scan response signal Sc2 in the capture mode to the second input and output unit 120B of the I/O interface circuit 120, in order to propagate the scan response signal Sc2 to the test machine 200 through the second input and output unit 120B. The test machine 200 determines whether the operation of the combinational 131 is correct according to scan response signal Sc2. The foregoing is only the concept of the scan chain test method, and those skilled in the art can understand the implementation details of the scan chain test method, so it will not be described here.

When the scan control signal SE is at the second level (i.e., the scan chain circuit 130 is controlled to the capture mode), since the test machine 200 do not need generate and send out the scan test signal Sc1 through the I/O interface circuit 120 (e.g., the first, the second and the third input and output unit 120A-120C), the I/O interface circuit 120 is in an idle and available state at this time. The present disclosure controls the state of the I/O interface circuit 120 through the control circuit 110 without the scan wrapper when the scan control signal SE is at the second level, so that the circuit under test 140 and test machine 200 may perform a signal transmission. Therefore, the registers of the scan unit F1-F2 may capture the output signals of the second subcircuit 140B, and let the test machine 200 determine whether the operations of the circuit under test 140, the logic circuit 112 (described in the subsequent paragraphs) and the I/O interface circuit 120 internal circuit are correct.

Accordingly, by using the I/O interface circuit 120 to propagate signals in the "capture mode" and the "shift mode", the test machine 200 enables to detect the circuit under test 140, and resolve the problem of traditional scan chain test method that "the combinational logics directly connected to the I/O interface circuit 120 in the microchip" is unable to detect.

To clearly illustrate the implementation details of the present disclosure, the operation of each input and output unit 120A-120C at interface circuit 120 is described herein. Referring to FIG. 2, when one input and output unit is a bi-directional interface (e.g., the input and output unit 120A-120C shown in FIG. 2), they all include an input terminal I, an output terminal O, a control terminal OE (output enable) and a testing terminal IO (i.e., external bi-directional input and output terminal). The drawing is only for the convenience of the description of the technology, not limited to the input and output units 120A-120C must be a bi-directional interface. In the shift mode, the first input and output unit 120A, i.e. scan input, is mainly used to receive the scan test signal Sc1. The second input and output unit 120B, i.e. scan output, is mainly used to output the scan response signal Sc2 to the test machine 200. Therefore, in practical applications, the first input and output unit 120A may be a bi-directional input and output interface or an unidirectional input interface. The second input and output unit 120B may be a bi-directional input and output interface or an unidirectional output interface. The third input and output unit 120C may be any types of the input and output interfaces. If the input and output unit 120A-120C is an unidirectional I/O interface, it will not include the control terminal OE. The unidirectional output interface will not include the output terminal O. The unidirectional input interface will not include the input terminal I. Since the internal circuit of the input and output unit 120A-120C can be understood by those skilled in the art, here only describe the operation related to the circuit testing method of the present disclosure. When the signal received by the control terminal OE is at the enable level, the input terminal I will be conducted to the testing terminal IO (hereinafter referred to as output state). At the same time, the testing terminal IO is also conducted to the internal output terminal O. That is, the input terminal I is indirectly connected to the output terminal O. When the signal received by the control terminal OE is at the disable level, the input terminal I is disconnect to the testing terminal IO. Only the testing terminal IO is conducted to the internal output terminal O (hereinafter referred to as input state).

As the embodiment shown in FIG. 2, the first input and output unit 120A of the I/O interface circuit 120 is regarded as the "scan input terminal" (SCAN_IN) of the scan chain test. The second input and output unit 120B is regarded as the "scan output terminal" (SCAN_OUT) of the scan chain test. The third input and output unit 120C is bi-directional input and output interface which are not responsible for propagating the scan control signals generated by test machine in the shift mode. For convenience of explanation, each terminal of the first input and output unit 120A is called to a first control terminal OE, a first testing terminal IO, a first input terminal I and a first output terminal O. Similarly, each terminal of the second input and output unit 120B are respectively called to a second control terminal OE, a second testing terminal IO, a second input terminal I and a second output terminal O. Each terminal of the third input and output unit 120C are respectively called to a third control terminal OE, a third testing terminal IO, a third input terminal I and a third output terminal O.

When the scan control signal SE is at the first level (i.e., in the shift mode), the control circuit 110 outputs a first control signal S1 and a third control signal S3, which are at the disable level, to the first control terminal OE and the third control terminal OE, so that the first input and output unit 120A receives the scan test signal Sc1 through the first output terminal O, and the third input and output unit 120C maintain to the input state. At the same time, the control circuit 110 outputs the second control signal S2, which is at the enable level, to the second control terminal OE, so that the second input and output unit 120B receives the scan response signal Sc2 generated by the scan chain circuit 130 through the second input terminal I, and propagates the scan response signal Sc2 to the test machine 200.

In some embodiments, the first control terminal OE is electrically connected to the control circuit 110, the first testing terminal IO is electrically connected to the test machine 200, the first output terminal O is electrically connected to the scan chain circuit 130 and the second subcircuit 140B. The second control terminal OE is electrically connected to the control circuit 110, the second testing terminal IO is electrically connected to the test machine 200, the second input terminal I is electrically connected to the scan chain circuit 130 and the first subcircuit 140A through the multiplexer.

In some embodiments, the control circuit 110 includes a switching circuit 111 and a logic circuit 112. The logic circuit 112 is an existing circuit of the microchip in the the normal working function, and its function is not limited. The switching circuit 111 is electrically connected to the logic circuit 112, and configured to receive the scan control signal SE from the test machine 200. When the scan control signal SE is at the second level, the switching circuit 111 conducts the logic circuit 112 to the control terminal OE of each of the input and output units 120A-120C of the I/O interface circuit 120 according to scan control signal SE, so that the test machine 200 may detect each area of the circuit under test 140 and logic circuit 112.

As shown in FIG. 2, here describe how the circuit testing system 100 works. When the scan control signal SE is at the first level, the logic circuit 112 of the control circuit 110 receives the input signal generated and sended from the test machine 200 (e.g., SM, SE, SF shown in FIG. 2), in this time, the switching circuit 111 is turned off, so the logic circuit 112 does not control the control terminal OE of each of the input and output units 120A-120C of the I/O interface circuit 120. When the scan control signal SE is at the second level, the logic circuit 112 generates an output signal according the normal working function. At this time, the switching circuit 111 is turned on, so the output signal generated by the logic circuit 112 will form a first control signal S1, a second control signal S2 and a third control signal S3 through the switching circuit 111. For example, if the first control signal S1 received by the first control terminal OE of the first input and output unit 120A is at the enable level, and the first input and output unit 120A is controlled to the state of output, the first input terminal I conducts to the first testing terminal IO in this time. If the signal received by the test machine 200 is correct, it means the operation of the first subcircuit 140A, which is connected with the first output terminal I, is correct, and the operations of the logic circuit 112 and the internal circuit of the first input and output unit 120A is correct.

Otherwise, if the second control signal S2 received by the second control terminal OE of the second input and output unit 120B is at the disable level, and the second input and output unit 120B is controlled to the state of input, the second output terminal O conducts to the first testing terminal IO in this time. After the operation of the shift mode and the capture mode, if the signal received by the test machine 200 is correct, it means that the operation of the second subcircuit 140B, which is connected with the second output terminal O, the scan chain circuit 130 and the logic circuit 112 are correct, and the operation of the internal circuit of the second input and output unit 120B is also correct. If the signal received by the test machine 200 does not match to the expectation, it means that one of the above testing circuits (e.g., the internal circuit of the second subcircuit 140B or the second input and output unit 120B) has error. Similarly, when the signal received by the control terminal OE of the other input and output units is at the enable level or at the disable level, it can use the same principle to determine whether the corresponding circuit under test 140 and input and output unit are correct.

In the capture mode of the scan chain test method, the present disclosure controls the I/O interface circuit 120 to make the circuit under test 140 and the test machine 200 performing the signal transmission in order to improve the detect coverage. However, during the switching between the shift mode and the capture mode, because the test machine 200 may send signals to each input and output unit 120A-120C in real time (without delay), but the scan control signal SE generated and sended from the test machine 200 to the control circuit 110 through the internal wiring of the microchip may make the control signals S1-S3 have huge delay. There is a certain chance to occur a problem that the test machine 200 and the I/O units 120A-1200 outputs signals at the same time. If both signals corresponds to the same wiring is different, it will generate "bus contention" to damage the input and output unit.

To avoid the generation of bus contention, the present disclosure provides three embodiments to resolve the bus contention. In the first embodiment, the circuit testing system 100 controls the test machine 200 first delay a predetermined time (hereinafter referred to as "turnaround time"), stopping sending signals to each of the input and output units 120A-120B during such interval, before generating the scan test signal Sc1.

As mention above, in the first embodiment, the test machine 200 generates the scan control signal SE and a scan auxiliary signal SF to the switching circuit 111. When the scan control signal SE is at the second level, and the scan auxiliary signal SF is at the disable level, the circuit under test 140 propagates the response signal to the test machine 200 through the I/O interface circuit 120. When the scan control signal SE is at the second level, and the scan auxiliary signal SF is at the enable level, the I/O interface circuit 120 is at the input state and will stop propagating the response signal sended from the circuit under test. At this time, the test machine 200 outputs a appropriate test signal (e.g., test signals St1-St3) to the input and output units 120A-120C of the I/O interface circuit 120.

Figure 3:
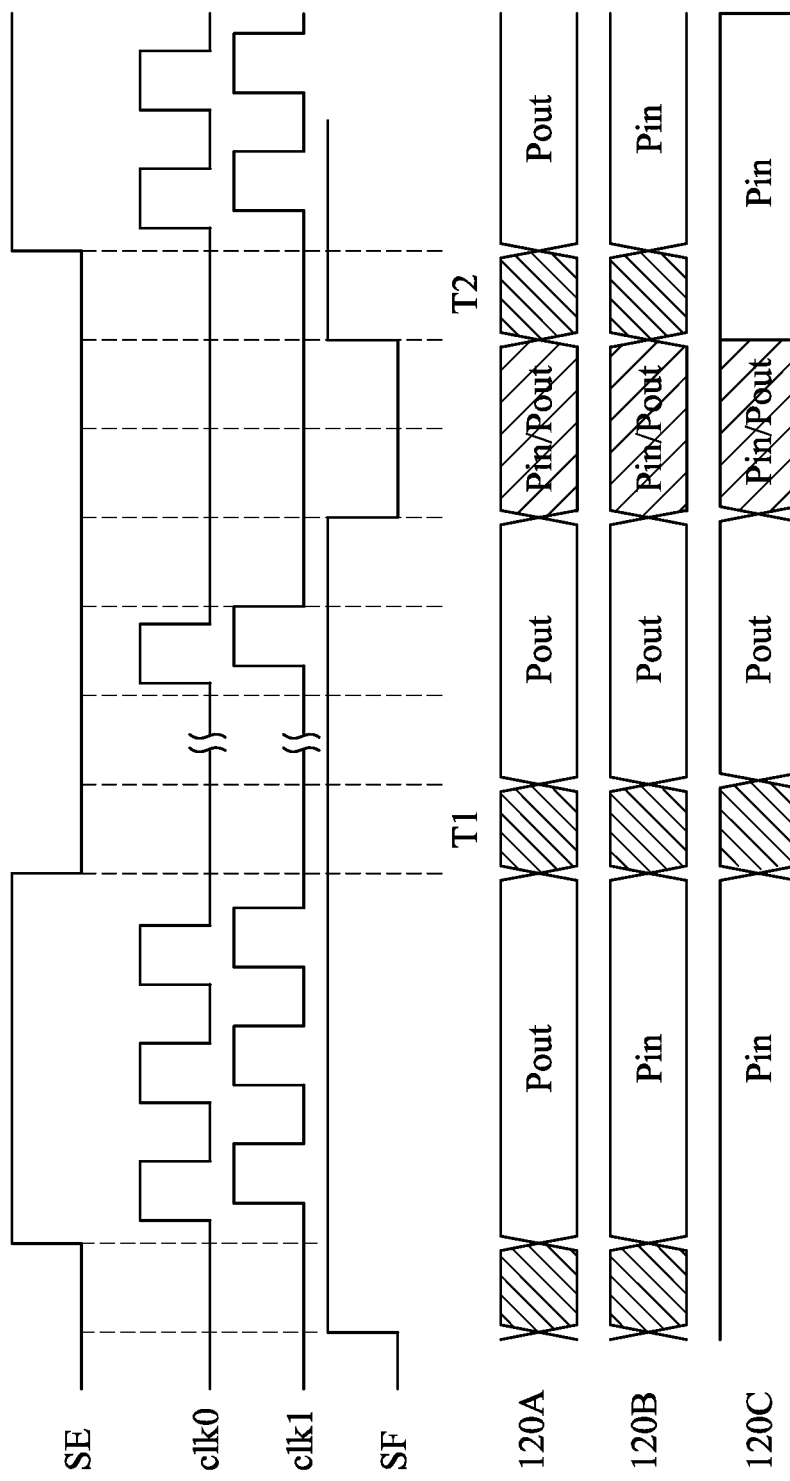
FIG. 3 is a waveform diagram of the circuit testing system in some embodiments of the present disclosure.

Referring to FIG. 3, FIG. 3 is a waveform diagram of the circuit testing system in some embodiments of the present disclosure. The clock signals clk0, clk1 are outputted from test machine 200 to the scan chain circuit 130 in the scan chain test method, and store the scan test signal Sc1 with the clock period to the register of the scan units F1-F4 one by one. In this embodiment, the scan control signal SE at the enable level represents the shift mode. The scan control signal SE at the disable level represents the capture mode. When the input and output units 120A-120C are configured to receive the signal generated and sended from the test machine 200, it is at a "external signal status Pout". When the input and output units 120A-120C are configured to receive and propagate the signal sended from the circuit under test 140 or the scan chain circuit 130, it is at the "internal signal status Pin".

As shown in FIG. 3, it uses the first input and output unit 120A as an example to illustrate how it works. In this embodiment, the first subcircuit 140A of the circuit under test 140 is electrically connected to the first input terminal I of the first input and output unit 120A. The second subcircuit 140B of the circuit under test 140 is electrically connected to the first output terminal O of the first input and output unit 120A. When the scan control signal SE is at the first level, the test machine 200 outputs a continuous clock signal, and generates and sends the different scan test signal Sc1 to the scan chain circuit 130 through the first input and output unit 120A according to the clock period. When the scan control signal SE changes from the first level to the second level, the test machine 200 stops outputting the clock signal. After the first turnaround time T1, the test machine 200 generates and send a first test signal St1 to the first input and output unit 120A in order to detect the second subcircuit 140B. After a while, the test machine 200 only outputs a clock pulse, and outputs operation results of the combinational 131 or the second subcircuit 140B (i.e., the second response signal Sr2) to the register of the scan units F1-F4.

Next, when the scan auxiliary signal SF is at the disable level, the switching circuit 111 is turned on. At this time, the test machine 200 receives the signal propagated via the first input and output unit 120A. The logic circuit 112 generates the first control signal S1 according to normal working function. The signal received by the first control terminal OE may be at the enable level or disable level, so the status of the first input and output unit 120A may be in the external signal status Pout or in the internal signal status Pin (depending on the result of the operation of logic circuit 112). If the signal received by the first control terminal OE is at the enable level, the first response signal Sr1, which is the operation result of the first subcircuit 140A, is propagated to the test machine 200 through the first input and output unit 120A. When the signal received by the first control terminal OE is at the disable level, the first input and output unit 120A may receive the first test signal St1 transmitted from the test machine 200. However, since the clock signal is stopped at this time, the operation results outputted by the second subcircuit 140E (e.g., the second response signal Sr2) according to the first test signal St1 is unable to propagate to the test machine 200 through the register of the scan chain circuit 130. But as described in the previous paragraph, when both the scan control signal SE is at the disable level and the scan auxiliary signal SF is at the enable level, the test machine 200 will trigger a clock pulse in order to store the second response signal Sr2 to the registers of the scan chain circuit 130. When entering the shift mode again next time, the second input and output unit 120B will propagate the stored second response signal Sr2 to the test machine 200 via the flip-flops, F1~F2, in scan chain circuit 130. Therefore, the testing coverage may fully cover the first subcircuit 140A, the second subcircuit 140B and the logic circuit 112 according to the method of the present disclosure.

In addition, as shown in FIG. 3, in some embodiments, when the test machine 200 receives the first response signal Sr1 through the first input and output unit 120A, the first I/O unit 120A is in the state of output (i.e., the first control signal S1 is enable). Before the scan control signal SE is controlled to the first level again (i.e., change to the shift mode again), the test machine 200 enables the scan auxiliary signal SF by advancing a clock period (e.g., the second turnaround time T2 shown in FIG. 3), so that the control circuit 110 actively controls the first control signal S1 to the disable level, and make the first input and output unit 120A changes to the scan input in advance. Then, entering the shift mode to avoid the bus contention. In the second turnaround time, the input and output units 120A-120C are in the states of input, and the wiring in the test machine 200, which electrically connected to the input and output units 120A-120C, are all in the input states.

In some embodiments, the first subcircuit 140A of the circuit under test 140 is further electrically connected to the second input terminal I, the second subcircuit 140B of the circuit under test 140 is further electrically connected to the second output terminal O. When the scan control signal SE changes from the first level to the second level, the test machine 200 stops sending the clock signal, and the scan auxiliary signal SF is still at the enable level in order that actively control the second input and output unit 120B as the state of input. After the first turnaround time T1, the test machine 200 generates the second test signal St2 to the second input and output unit 120B, in order to avoid the bus contention. The second test signal St2 generated and sended from the test machine 200 will be propagate to the second subcircuit 140B, then trigger a clock pulse, so that the register of the scan units F1-F4 captures the operation results of the second response signal Sr2 and the combinational 131. Next, the scan auxiliary signal SF change to the disable level, so that the logic circuit 112 generates a second control signal S2 according the normal working functionality, and the test machine 200 is capable of receiving the signal outputted by the second input and output unit 120B. The second control terminal OE may receive a enable level signal or a disable level signal, it is operated in the same way as the first input and output unit 120A described above, so it will not be described here. When the scan control signal SE returns to the first level (i.e., at the shift mode) again, the test machine 200 receives the first response signal Sr1 propagated from the circuit under test 140 through the second input and output unit 120B, the test machine 200 enables the scan auxiliary signal SF by advancing to a clock period (i.e., a second turnaround time T2), so that the control circuit 110 actively controls the outputted second control signal S2 to the disable level, and the second input and output unit 120B changes to input state in advance. Then, entering to the shift mode, receiving scan response signal Sc2 outputted by the scan chain circuit 130 (i.e., performing the action of the shift mode) through the second input and output unit 120B. In some embodiments, the second response signal Sr2 is stored in the register of the scan chain circuit 130, and is propagated to the test machine 200 in the shift mode through the second input and output unit 120B in order to determine the test result. For the second input and output unit 120B (SCAN_OUT I/O), the bus contention only occurred at the time when it changes from the shift mode to the capture mode. For the first input and output unit 120A (SCAN_IN I/O), the bus contention only occurred at the time that when it changes from the capture mode to the shift mode.

Similarly, the control circuit 110 can control the control terminal OE of the third input and output unit 120C with a third control signal S3 to detect whether its internal circuit is correct. When the scan control signal SE changes from first level to the second level, the test machine 200 can also send the third test signal St3 to the third input and output unit 120C after the first turnaround time T1 to avoid the bus contention problem. In addition, in some embodiments, the length of the first turnaround time T1 or the second turnaround time T2 should be at least one period of the clock signal clk0, clk1. Thus, the test machine 200 and the I/O units 120A-120C can be prevented from simultaneously propagating signals to the same wire connecting test machine 200 with any pad of I/O unit 120A-120C.

In some embodiments, the switching circuit 111 is configured to receive a scan control signal SE and a scan auxiliary signal SF. When the scan control signal SE is at the second level (e.g., disable level) and the scan auxiliary signal SF is at the disable level, the switching circuit 111 conducts the logic circuit 112 to the I/O interface circuit 120. The foregoing operation mode has been shown in the waveform shown in FIG. 3. The truth table of the control circuit 110 is as shown in Table 1:

TABLE 1

| SE | SF | Action of the control circuit 110 |
|---|---|---|
| 1 | 1 | maintain the first control terminal OE and the third control terminal OE at the disable level, maintain the second control terminal OE at the enable level |
| 1 | 0 | maintain the first control terminal OE at the disable level, and maintain the second control terminal OE at the enable level, the logic circuit 112 outputs signal to the third control terminal OE |
| 0 | 1 | maintain the first control terminal OE, the second control terminal OE and the third control terminal OE at the disable level |
| 0 | 0 | the logic circuit 112 outputs signal to the first control terminal OE, the second control terminal OE and the third control terminal OE |

Figure 4A:
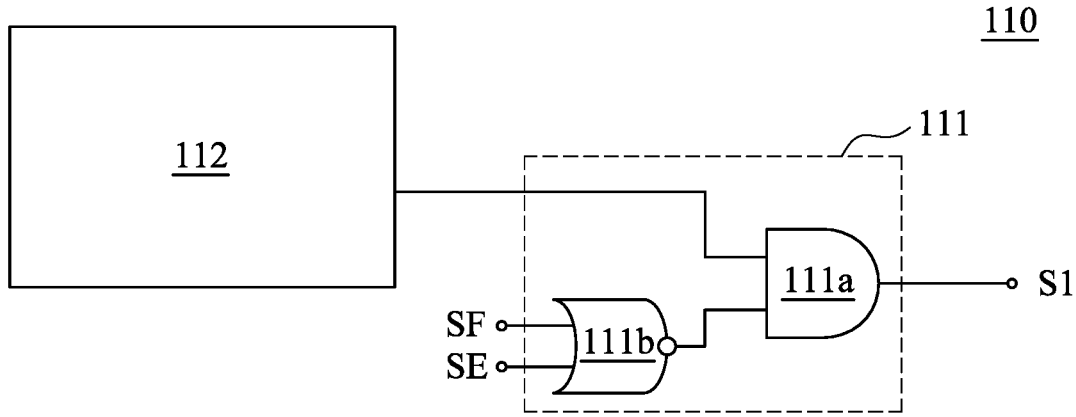
FIGS. 4A-4C are schematic diagrams of switching circuits in some embodiments of the present disclosure.

FIG. 4A is a schematic diagram of the switching circuit 111 configured to control the first input and output unit 120A. In some embodiments, the switching circuit 111 includes an AND gate 111a and a NOR gate 111b. The two input terminals of the NOR gate 111b are configured to receive the scan control signal SE and the scan auxiliary signal SF. The two input terminals of the AND gate 111a are electrically connected to the to logic circuit 112 and the output terminal of the NOR gate 111b. The output terminal of the AND gate 111a is used to output the first control signal S1 to control the first control terminal OE of the first input and output unit 120A.

Figure 4B:
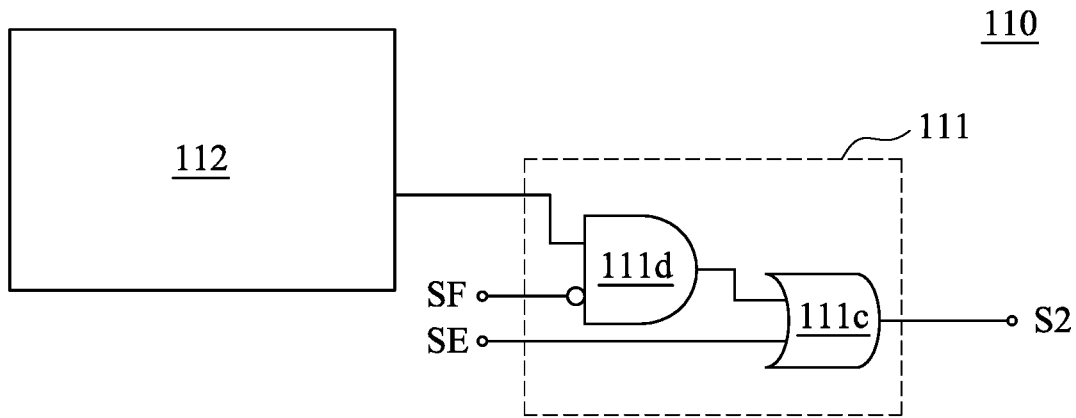

FIG. 4B is a schematic diagram of the switching circuit 111 configured to control the second input and output unit 120B. In some embodiments, the switching circuit 111 includes a NIMPLY gate 111d and an OR gate 111c. The two input terminals of the N IMPLY gate 111d are configured to receive a scan auxiliary signal SF and electrically connected to the logic circuit 112. The two input terminals of the OR gate 111c are electrically connected to the output terminal of the NIMPLY gate 111d, and used to receive the scan control signal SE. The output terminal of the OR gate 111c is used to output a second control signal S2 to control the second control terminal OE of the second input and output unit 120B.

Figure 4C:
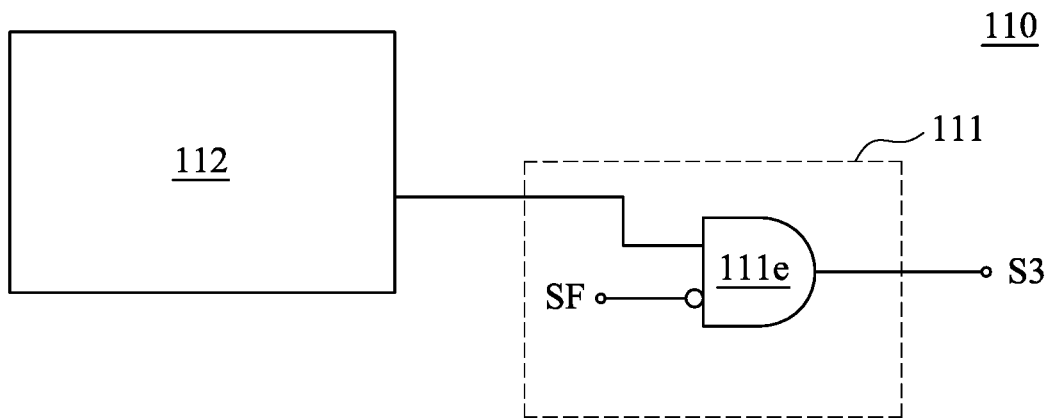

FIG. 4C is a schematic diagram of the switching circuit 111 configured to control the third input and output unit 120C. In some embodiments, the switching circuit 111 includes a the NIMPLY gate 111e. The two input terminals of the NIMPLY gate 111e are respectively configured to receive a scan auxiliary signal SF and electrically connected to the logic circuit 112. Accordingly, when the scan auxiliary signal SF is at the disable level, the switching circuit 111 conducts the logic circuit 112 to the third input and output unit 120C.

Figure 5:
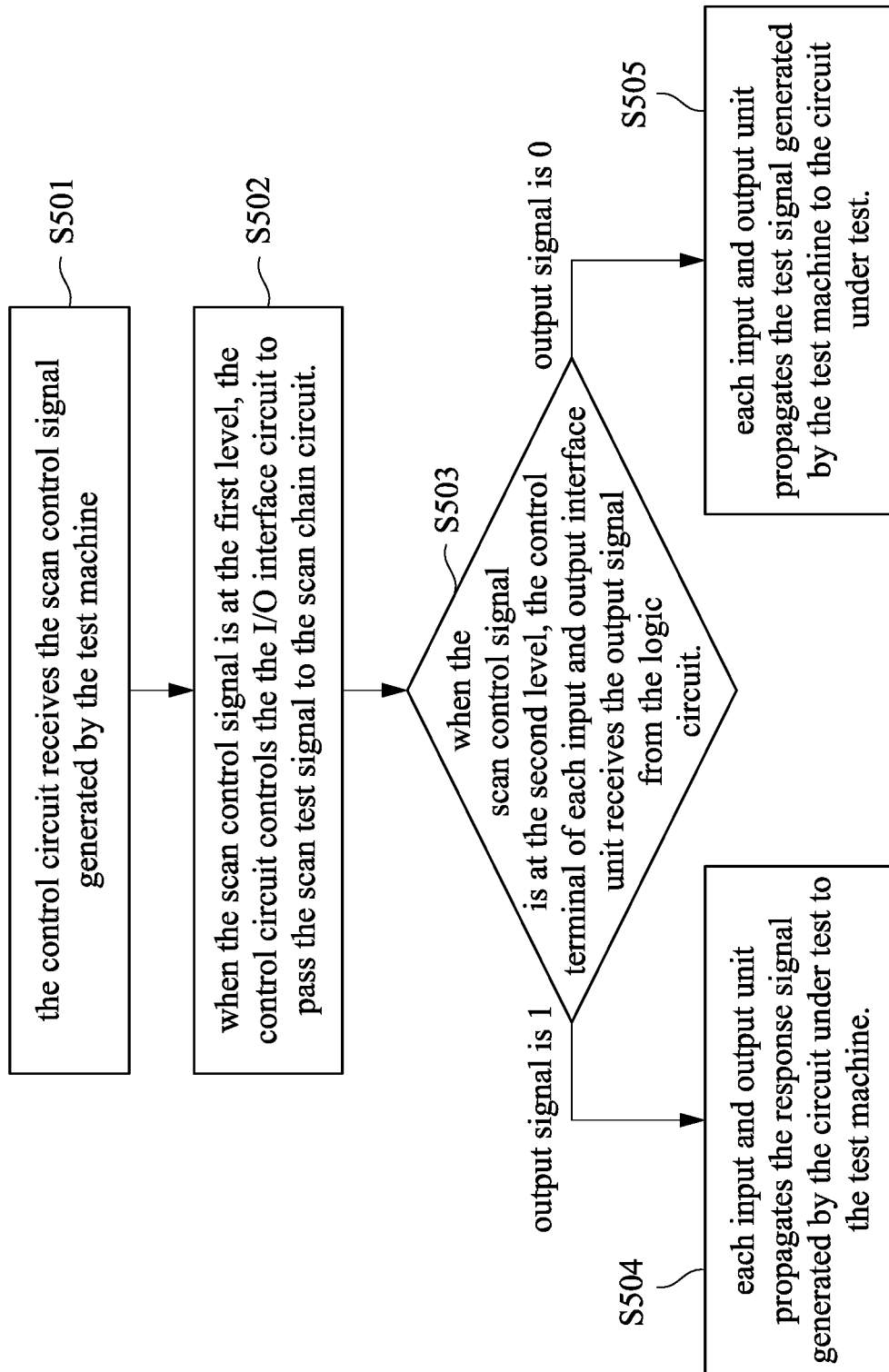
FIG. 5 is a flowchart illustrating the circuit testing method in some embodiments of the present disclosure.

Referring to FIG. 5, here is the flowchart of the circuit testing method. In step S501, the control circuit 110 receives the scan control signal SE from the test machine 200. In step S502, when the scan control signal SE is at the first level (i.e., the shift mode), the control circuit 110 controls the I/O interface circuit 120 to receive the scan test signal Sc1 through the first input and output unit 120A, and then the scan test signal Sc1 is propagated to the registers connected in series in the scan chain circuit 130. The purpose is to set the initial value of the register. When the scan control signal SE is at the second level, the scan chain circuit 130 operates according to the scan test signal Sc1. When the scan control signal SE returns to the first level again, the test machine 200 can receive the scan response signal Sc2 through the second input and output unit 120B. This is the process of the scan test.

In step S503, when the scan control signal SE is at the second level (i.e., the capture mode), the control terminal OE of each of the input and output units 120A-120C receives the output signal generated by the logic circuit 112, and generates the first control signal S1, the second control signal S2 and the third control signal S3, so that the input and output units 120A-120C may be electrically connected to the circuit under test 140 to detect. At the beginning of the capture mode, the test machine 200 stops generating the clock signal clk and maintains the scan auxiliary signal SF at the first level (e.g., the enable level), so that the output signal received by the control terminal OE of each of the input and output units 120A-120C is disable level. Each input and output unit 120A-120C propagate the test signal St1-St3 generated by the test machine 200 to the circuit under test 140. Next, the test machine 200 outputs a clock signal clk for one cycle pulse to store the second response signal Sr2 into the electrically linked register in the scan chain circuit 130. When entering the shift mode again, the second response signal Sr2 may be propagated to the test machine 200 through the second input and output unit 120B.

Waiting at least one clock period after generating the clock signal (clk pulse), the test machine 200 changes the scan auxiliary signal SF at the second level (e.g., the disable level). At this time, the logic circuit 112 operates to generate the first control signals S1, the second control signals S2 and the third control signals S3 according to the normal working function. The control signals S1-S3 may be at the enable level or at the disable level due to the value captured by the scan units F1-F4, and the circuit characteristics of the first subcircuit 140A and the logic circuit 112. In step S504, if the first control signal S1 is enabled, the first response signal Sr1 generated and outputted by the first subcircuit 140A may be directly propagated to the test machine 200 through the first input and output unit 120A. Similarly, the second control signals S2 and the third control signals S3 correspond to the input and output units 120B, 120C. That is, when the output signal received by the control terminal OE of each input and output units 120A-120C is at the enable level, each input and output unit 120A-120C propagates the first response signal Sr1 generated by the first subcircuit 140A to the test machine 200.

In step S505, if the output signal received by the control terminal OE of each input and output unit 120A-120C is at the disable level, each of the input and output units 120A-120C propagates the test signal St1-St3 generated by the test machine 200 to the second subcircuit 140B of the circuit under test 140. Through the above operations, all of the logic circuit 112, the scan chain circuit 130, the circuit under test 140 and each of the input and output units 120A-120C may be coverage. For example, if the test machine 200 receives the first response signal Sr1 through the first input and output unit 120A, it can be determined whether the manufactured circuits of the first input and output unit 120A and the first subcircuit 140A are correct or not. Similarly, if the test machine 200 receives the first response signal Sr1 through the second input and output unit 120B, it can determine whether the second input and output unit 120B and the first subcircuit 140A is correct.

Figure 6:
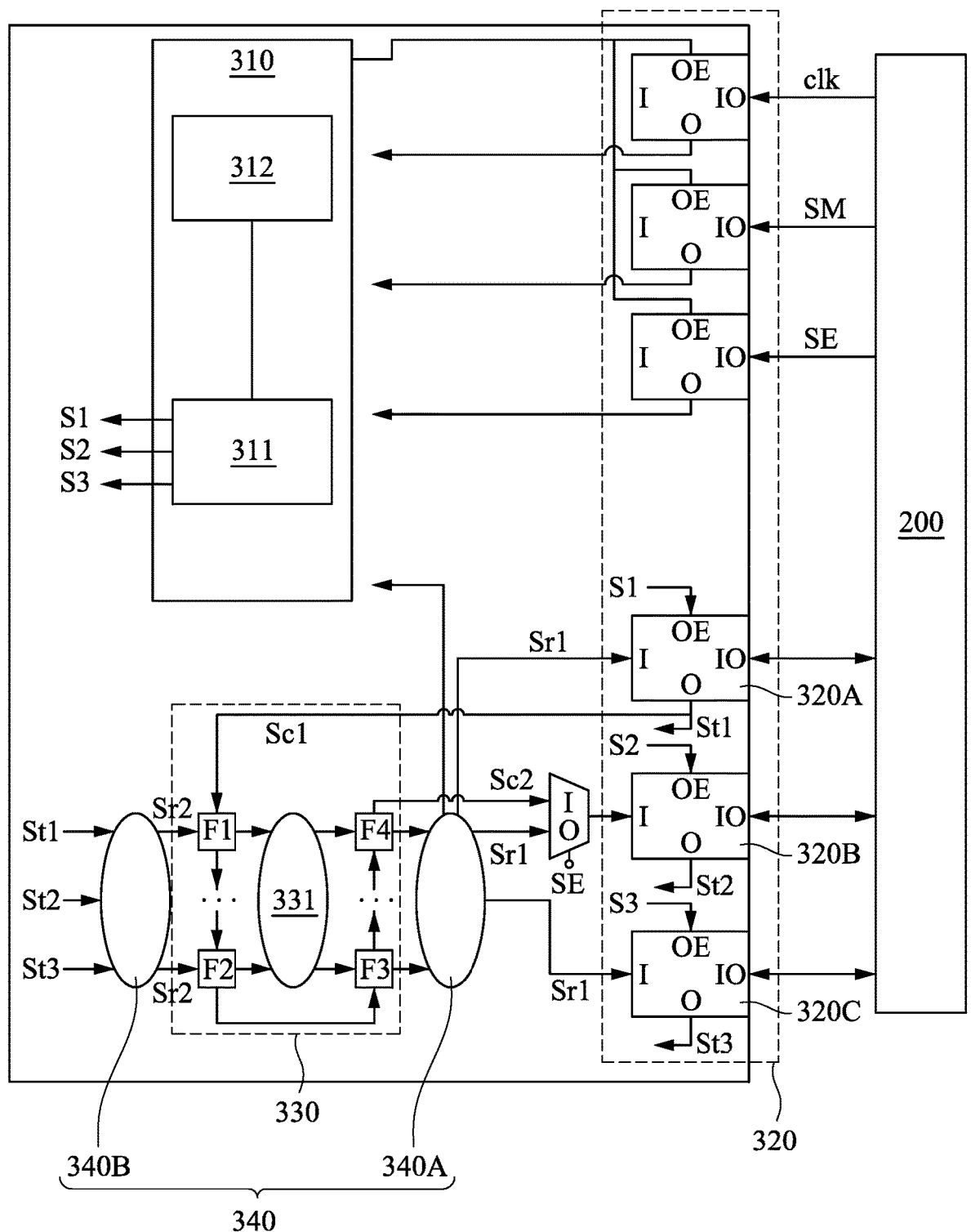
FIG. 6 is a schematic diagram of a circuit testing system in some embodiments of the present disclosure.

Referring to FIG. 6, FIG. 6 is a system schematic diagram configured to resolve the bus contention problem of the present disclosure in the second and the third embodiment. The circuit testing system 300 includes a control circuit 310, an interface circuit 320, a scan chain circuit 330 and a circuit under test 340. The control circuit 310 is electrically connected to the test machine 200, and configured to receive the scan control signal SE. The I/O interface circuit 320 is electrically connected to the control circuit 310, the test machine 200, the scan chain circuit 330 and the circuit under test 340. When the scan control signal SE is at the first level, the control circuit 310 is configured to control the I/O interface circuit 320 to conduct the scan chain circuit 330 to the test machine 200 in order to propagate the scan test signal Sc1 outputted from the test machine 200 to the register connected in series in the scan chain circuit 330. When the scan control signal SE is at the second level, the control circuit 310 is configured to control the I/O interface circuit 320 to conduct the circuit under test 340 to the test machine 200, so that the first response signal Sr1 generated by the first subcircuit 340A in the circuit under test 340 may be propagated to the test machine 200. In addition, by generating a clock signal (scan clk), the test machine 200 control the register in the scan chain circuit 330 to capture the response signal generated by the circuit under test 340 (e.g., the second response signal Sr2) and an operation result of the combinational 331. When the scan control signal SE returns to the first level again (i.e., next shift mode), the I/O interface circuit 320 may propagate the captured value of the register in the scan chain circuit 330 to the test machine 200 to determine.

For avoid the problem that the circuit testing system 300 occur the bus contention in the capture mode, in the second embodiment of the present disclosure, when the scan control signal SE is at the second level, the control circuit 310 control each of the control terminal OE of the input and output units 320A-320C is at the enable level, so that each of the input and output unit 320A-320C are controlled to be the state of output. Since the input and output unit 320A-320C is not configured to receive the signal generated and sended from the test machine 200 at the output state, when the scan control signal SE is changed from the first level to the second level (i.e., changes from the enable level to the disable level), it ensures that it will not occur a bus contention situation that "when the input and output unit (e.g., the second input and output unit 320B) and test machine 200 output signal to the same net which connecting each other at the same time".

As an embodiment shown in FIG. 6, the first input and output unit 320A of the I/O interface circuit 320 is regarded as the input terminal of the scan chain test. The second input and output unit 320B is regarded as the output terminal of the scan chain test. The first subcircuit 340A of the circuit under test 340 is electrically connected to the input terminal I of the input and output unit 320A-320C. The second subcircuit 340B of the circuit under test 340 is electrically connected to the output terminal O of the input and output unit 320A-320C. Drawings are only for the convenience of the description of the technology, not limited to the input and output unit 320A-320C must be a bi-directional interface. The first input and output unit 320A is mainly used to receive the scan test signal Sc1 in the shift mode. The second input and output unit 320B is mainly used to output the scan response signal Sc2 to the test machine 200. Accordingly, in some embodiments, the first input and output unit 320A may be a bi-directional input and output interface, or be a unidirectional input interface. The second input and output unit 320B may be a bi-directional input and output interface, or be a unidirectional output interface. The third input and output unit 320C may be any types of the input and output interface. If one of the input and output units 320A-320C is a unidirectional input interface or a unidirectional output interface, it will not include a control terminal OE. If one of the input and output units 320A-320C is a unidirectional output interface, it will not include an output terminal O. If one of the input and output units 320A-320C is a unidirectional input interface, it will not include an input terminal I.

In the second embodiment of the present disclosure, when the scan control signal SE is at the second level, the control circuit 310 controls the control terminal OE of the input and output unit 320A-320C at the enable level.

Figure 7:
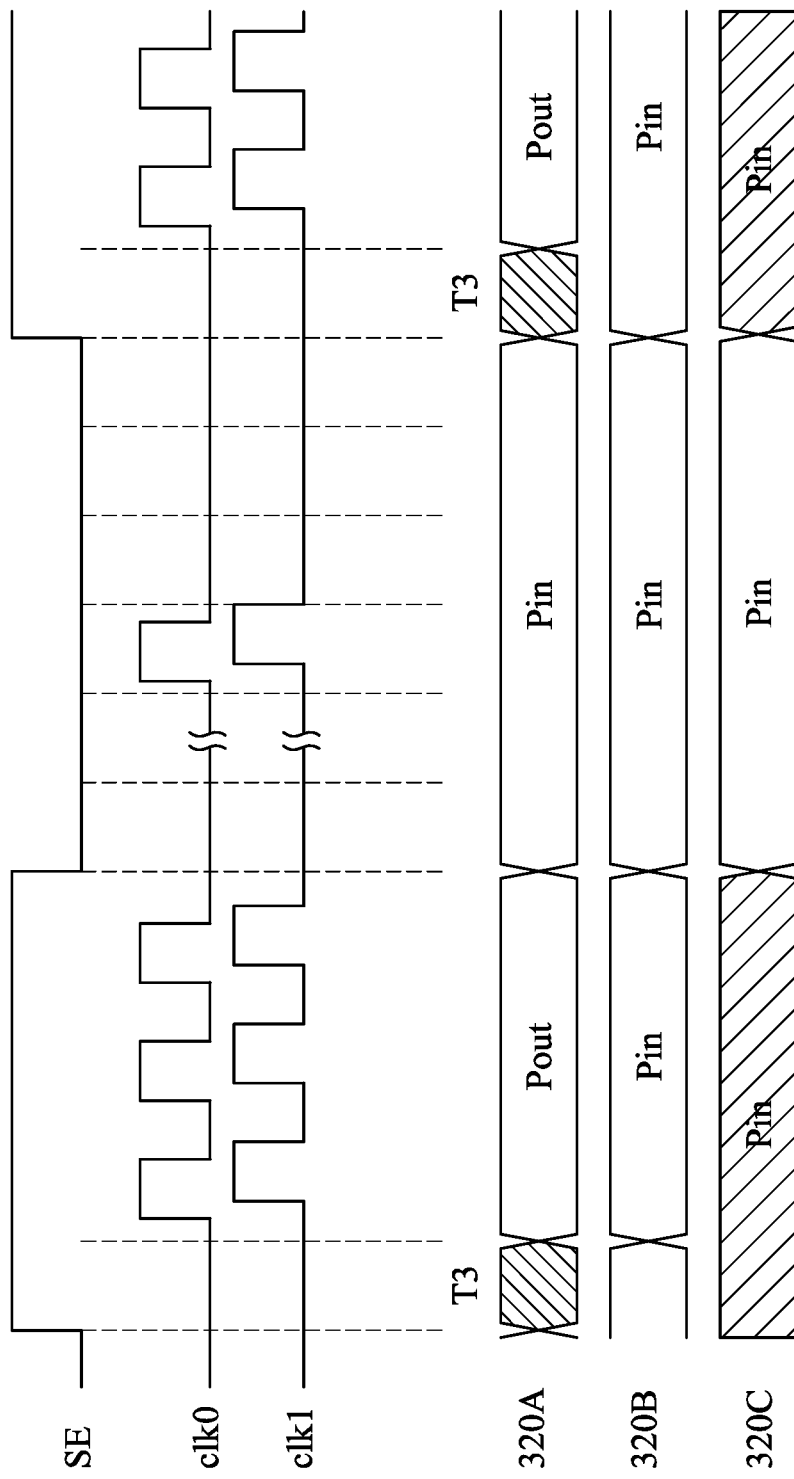
FIG. 7 is a waveform diagram of the circuit testing system in some embodiments of the present disclosure.

As shown in FIG. 6 and FIG. 7, the circuit testing system 300 may detect the circuit under test 340 through the input and output units 320A-320C of the I/O interface circuit 320. Take the second input and output unit 320B as an example to explain the method that detects the circuit under test 340 through the second input and output unit 320B. When the scan control signal SE is at the first level (i.e., at the shift mode), the test machine 200 continuously outputs the clock signal (scan clk), and outputs the scan test signal Sc1 to the scan chain circuit 330 through the first input and output unit 320A at every the clock period. When the shift mode ends, the register of the scan chain circuit 330 stores various test patterns set by the test machine 200. The method of the circuit testing system 300 performing the scan chain test is same as the embodiment of FIG. 2, so it will not be described here.

When the scan control signal SE is at the second level (i.e., at the capture mode), the test machine 200 stops outputting the clock signal clk, and the control circuit 310 controls the second control terminal OE is at the enable level. At this time, the test pattern set by the register of the above scan chain circuit 330 is taken as the input value of the first subcircuit 340A, then generates the first response signal Sr1 after the operation. Next, through the second input terminal I and the internal circuit of the second input and output unit 320B, propagating the first response signal Sr1 to the test machine 200.

At the same time, it forms a lookback path through the second input terminal I of the second input and output unit 320B and the second output terminal O of the second input and output unit 320B, and propagates the first response signal Sr1 to the second subcircuit 340B. The test machine 200 may determine whether the operation of the internal circuit of the first subcircuit 340A and the second input and output unit 320B is correct according to first response signal Sr1. After an appropriate delay time, the test machine 200 outputs a clock signal, so that the register of the scan chain circuit 330 capture the second response signal Sr2 and the operation result of the combinational 331. When the scan control signal SE changes from the second level to the first level again (i.e., at the shift mode), the test machine 200 starts outputs a periodic clock signal clk to the circuit testing system 300. At this time, the test machine 200 outputs a scan test signal Sc1 through the first input and output unit 320A of the I/O interface circuit, and shift and sets the register of the scan chain circuit 330 with the period of the clock pulse one by one. The register of the scan chain circuit 330 shift and output the captured operation result to the test machine 200 one by one through the second input and output unit 320B of the I/O interface circuit. By the foregoing manner, the second response signal Sr2 and the operation result of the combinational 331 can be obtained, then it can determine the operation of the second subcircuit 340B, the combinational 331 and the second input terminal I and the second output terminal O of the I/O interface circuit 320B is correct.

Similarly, the circuit testing system 300 further detects the circuit under test 340 and the internal circuit of the first input and output unit 320A through the first input and output unit 320A. As shown in FIG. 6, when the scan control signal SE is at the second level, the test machine 200 stops outputting the clock signal clk, and the control circuit 310 controls the first control terminal OE is at the enable level. The first subcircuit 340A obtains the scan test signal Sc1 generated and sended from the test machine 200 through the register of the scan chain circuit 330, Next, propagating the first response signal Sr1 to the test machine 200 through the first input terminal I of the first input and output unit 320A. At the same time, propagating (lookback) the first response signal Sr1 to the second subcircuit 340B through the first output terminal O of the first input and output unit 320A. The test machine 200 determines whether the operation of the internal circuit of the first subcircuit 340A and the first input and output unit 320A is correct according to first response signal Sr1. After an appropriate delay time, the test machine 200 outputs a pulse signal, so that the register of the scan chain circuit 330 captures the second response signal Sr2 and the operation result of the combinational 331. After the scan control signal SE changes from the second level to the first level, the clock signal is restarted and the captured operation result of the register of the scan chain circuit 330 passes through the second input and output unit 320B to the test machine 200. The test machine 200 accordingly determines the operation of the second subcircuit 340B, the combinational 331 and the control terminal OE, the first input terminal I and the first output terminal O of the I/O interface circuit 320A is correct.

Similarly, the test machine 200 may generate the third test signal St3 and receive the first response signal Sr1 through the third input and output unit 320C in order to detect the internal circuit of the circuit under test 340 and the third input and output unit 320C. In the second and the third embodiments of the present disclosure, when in the shift mode, the third control signal S3 outputted by the control circuit 310 is at the disable level, so that the third input and output unit 320C is in the input state. The test machine 200 does not output signal to the third input and output unit 320C. When changing to the capture mode, the third control signal S3 outputted by the control circuit 310 is at the enable level, so that third input and output unit 320C is in the state of output. Propagating (lookback) the first response signal Sr1 to the second subcircuit 340B through the third input terminal I and third output terminal O of the third input and output unit 320C. By the foregoing manner, it can avoid the bus contention, and determine whether the operation of the circuit under test 340 and the third input and output unit 320C internal circuit is correct.

The second embodiment of the present disclosure may improve the coverage of the scan test to cover the first subcircuit 340A, the second subcircuit 340B, the first input and output unit 320A, the second input and output unit 320B and the internal circuit of the third input and output unit 320C. To avoid the bus contention, the solution is controlling each of the input and output units 320A-320C to the state of "output" in the capture mode. Accordingly, when the scan control signal SE changes from the first level to the second level (i.e., from the enable level to the disable level), it will not occur the situation that "the I/O units 320A-320C and the test machine 200 propagate signals to the same net which connecting each other at the same time", and it can avoid to the bus contention.

In the second embodiment of the present disclosure, when the scan control signal SE changes from the second level (capture mode) to the first level (shift mode), the first input and output unit 320A changes from the output state to the input state. At this time, since the scan control signal SE delays transmission to the control circuit 310, bus contention will occur. In the second embodiment of the present disclosure, when changing from the capture mode to the shift mode, the test machine 200 outputs the scan test signal Sc1 to the first input and output unit 320A after delays at least a clock period (e.g., the third turnaround time T3 shown in FIG. 7), so that it can avoid the bus contention occurs to the first input and output unit 320A. In addition, the third control signal S3 outputted by the control circuit 310 in the capture mode is enable level. And the third control signal S3 outputted by the control circuit 310 in the shift mode is at the disable level. At this time, the test machine 200 is controlled not to output signal to the third input and output unit 320C. Accordingly, the bus contention will not occur between the third input and output unit 320C and the test machine 200.

Figure 8:
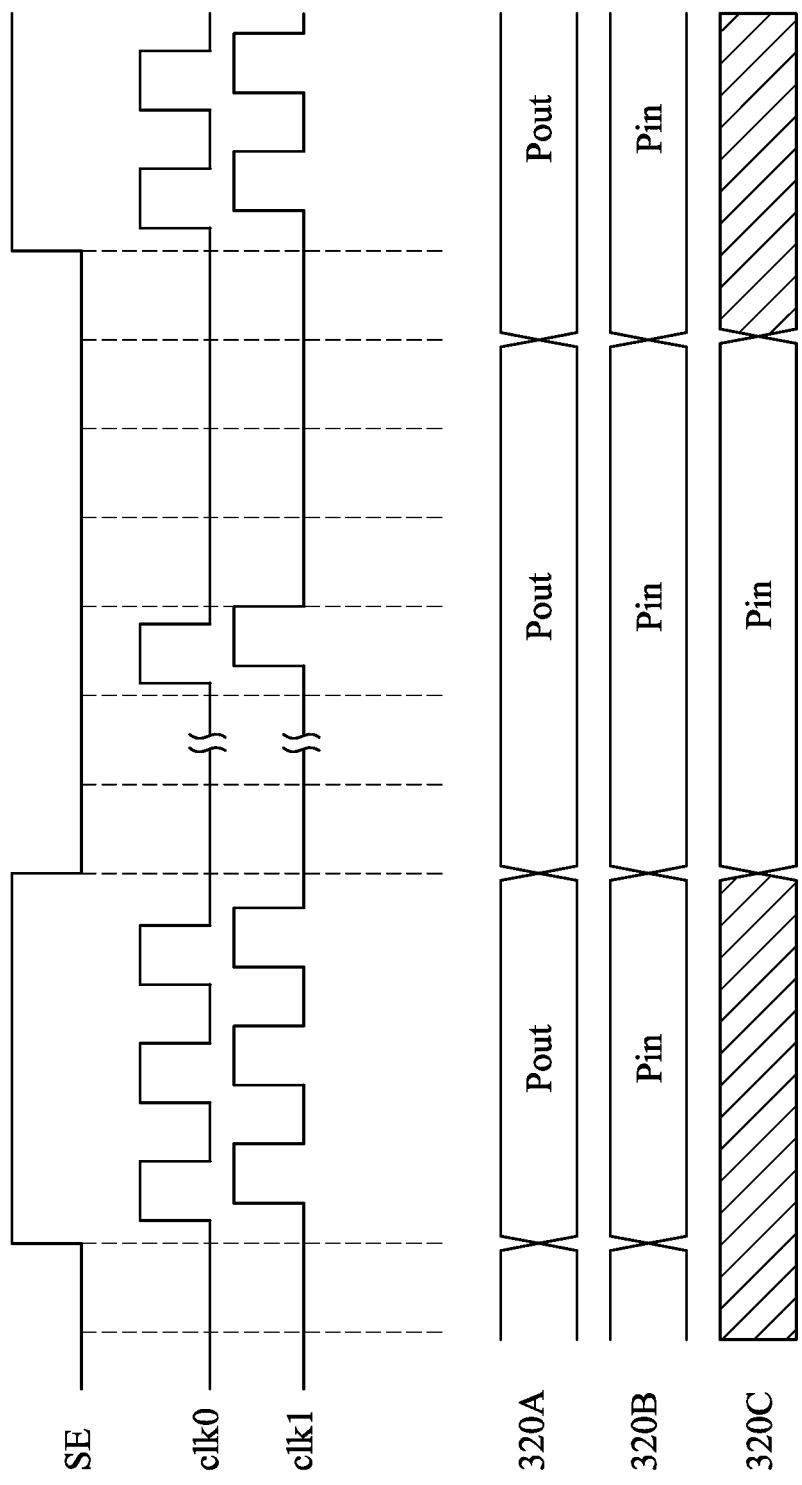
FIG. 8 is a waveform diagram of the circuit testing system in some embodiments of the present disclosure.

In the above second embodiment, it avoids the first input and output unit 320A to occur the bus contention by delaying sending signals out from the test machine. In the third embodiment of the present disclosure, referring to FIG. 6 and FIG. 8, the control circuit 310 limits the first input and output unit 320A, which is configured to receive the scan test signal Sc1, to the input state (i.e., the first control terminal OE maintains to the disable level) in the capture mode. Accordingly, as shown in FIG. 8, by maintaining the first input and output unit 320A at the status "external signal status Pout", although the coverage of the detection will be reduced, it is a more simple manner to avoid the bus contention. As shown in FIG. 6, when the scan control signal SE is at the second level (i.e., at the capture mode), the control circuit 310 limits the first control terminal OE of the first input and output unit 320A to the disable level. Accordingly, the first input and output unit 320A does not receive the first response signal Sr1 propagated from the first subcircuit 340A of the circuit under test 340 through the first input terminal I, so that it will not occur the bus contention when the scan control signal SE changes from the second level to the first level (i.e., from the disable level to the enable level). In the third embodiment of the present disclosure, if it needs to determine whether the operation of the first response signal Sr1 is correct, the test machine 200 need to receive the first response signal Sr1 through the second input and output unit 320E and the third input and output unit 320C in the capture mode so as to confirming the operation of the first subcircuit 340A.

The test machine 200 generates and sends the first test signal St1 to the second subcircuit 3408 through the first output terminal O of the first input and output unit 320A. At the same time, the circuit testing system 300 also use the received first response signal Sr1 as the second test signal St2 and the third test signal St3, and respectively propagates (lookback) to the second subcircuit 340B through the second input and output unit 320E and the input terminal I and the output terminal O of the third input and output unit 320C. After the second subcircuit 340B finishes the operation according to the first test signal St1, the second test signal St2 and the third test signal St3, the test machine 200 control the register of the scan chain circuit 330 to capture the second response signal Sr2 by triggering a clock pulse. When the circuit testing system 300 returns in to the shift mode, the data of the register of the scan chain circuit 330 is shifted out from the circuit testing system to the test machine 200 one by one, so that the test machine 200 determines whether the second subcircuit 340B, the combinational 331, the register of the scan chain circuit 330, the internal circuit of the second input and output unit 320E and the internal circuit of the third input and output unit 320C is correct. Although this method cannot test the state of the first subcircuit 340A through the first input and output unit 320A, and affects the fault coverage of the first input terminal I of the first input and output unit 320A, and affects the relevant circuit (e.g., the logic circuit 312) of input and output unit 320A and its control terminal OE, this method can completely avoid the problem of bus contention in the I/O interface circuit 320.

Figure 9A:
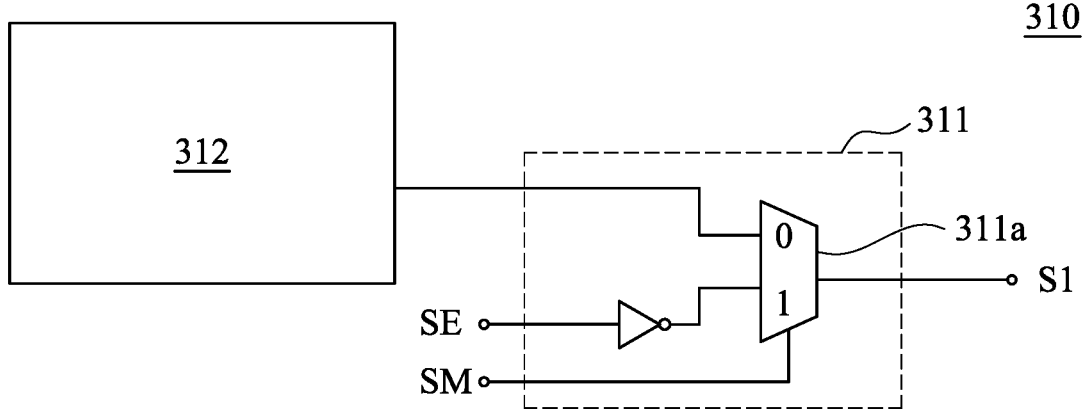
FIGS. 9A-9C are schematic diagrams of switching circuits in some embodiments of the present disclosure.
Figure 9B:
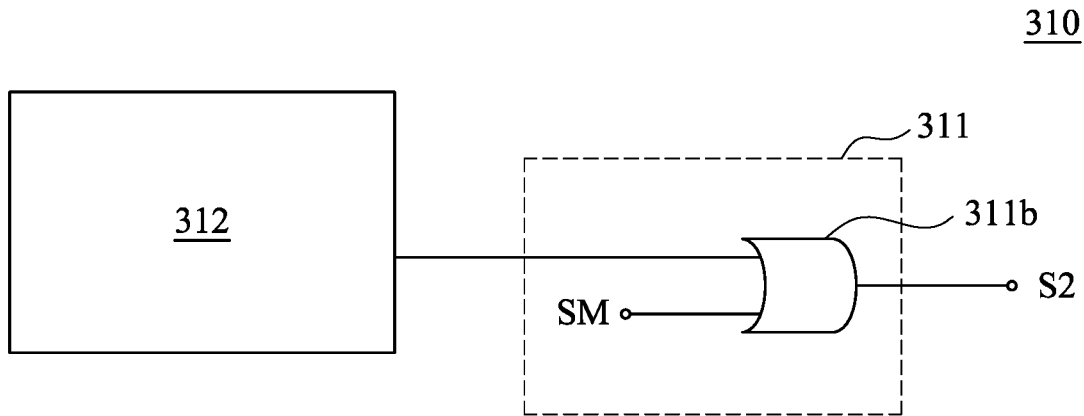
Figure 9C:
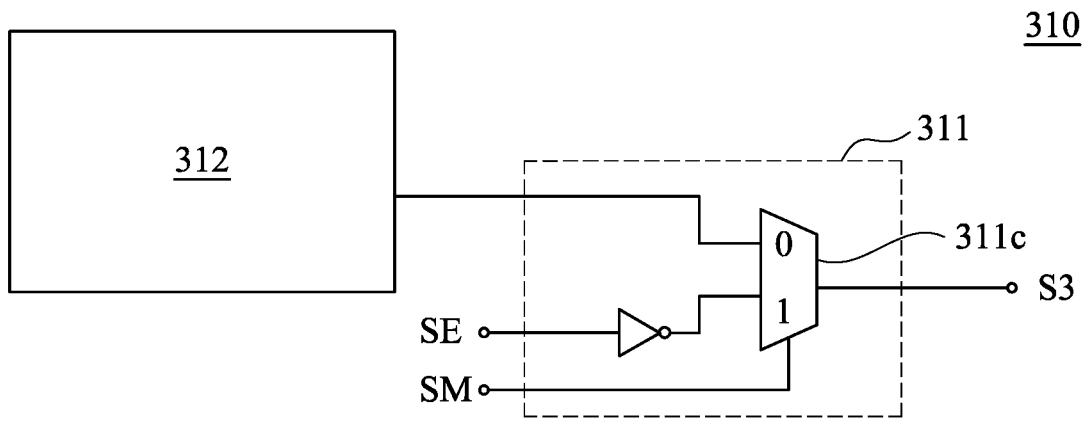

In some embodiments, the control circuit 310 includes a switching circuit 311 and a logic circuit 312. Referring to FIG. 9A, FIG. 9B and FIG. 9C, show different embodiments of switching circuit 311, respectively. In the second embodiment of the present disclosure, as shown in FIG. 9A, FIG. 9A is a schematic diagram of the switching circuit 311 of the control circuit 310 configured to control the first input and output unit 320A. The switching circuit 311 includes a switching circuit 311a (e.g., a multiplexer). The two input terminals of the switching circuit 311a are electrically connected to the logic circuit 312, and receives the scan control signal SE through the inverter. The control terminal of the switching circuit 311a is configured to receive the scan mode signal SM generated and sended from the test machine 200. The scan mode signal SM is maintained to the enable level during whole testing interval. In the capture mode, after the scan control signal SE is inputted to the switching circuit 311a through the inverter, the switching circuit 311a controls the first control terminal OE of the first input and output unit 320A to the enable level.

In the second and the third embodiments, FIG. 9B is a schematic diagram of the switching circuit 311 of the control circuit 310 configured to control the second input and output unit 320B. The switching circuit 311 includes an OR gate 311b. The two input terminals of the OR gate 311b are electrically connected to the logic circuit 312 and the scan mode signal SM. Accordingly, the control circuit 310 may control the second input and output unit 320B to continuously maintain to the enable level.

In some embodiments, referring to FIG. 9C, FIG. 9C is a schematic diagram of the switching circuit 311 of the control circuit 310 configured to control the third input and output unit 320C. The switching circuit 311 includes a switching circuit 311c, and the two input terminals of the switching circuit 311c are electrically connected to the logic circuit 312, and receives the scan control signal SE through the inverter. The control terminal of the switching circuit 311c is switched according to scan mode signal SM, so that after the scan control signal SE is outputted to the switching circuit 311c through the inverter in the capture mode, the switching circuit 311c controls the third control terminal OE of the third input and output unit 320C at the enable level.

Figure 10:
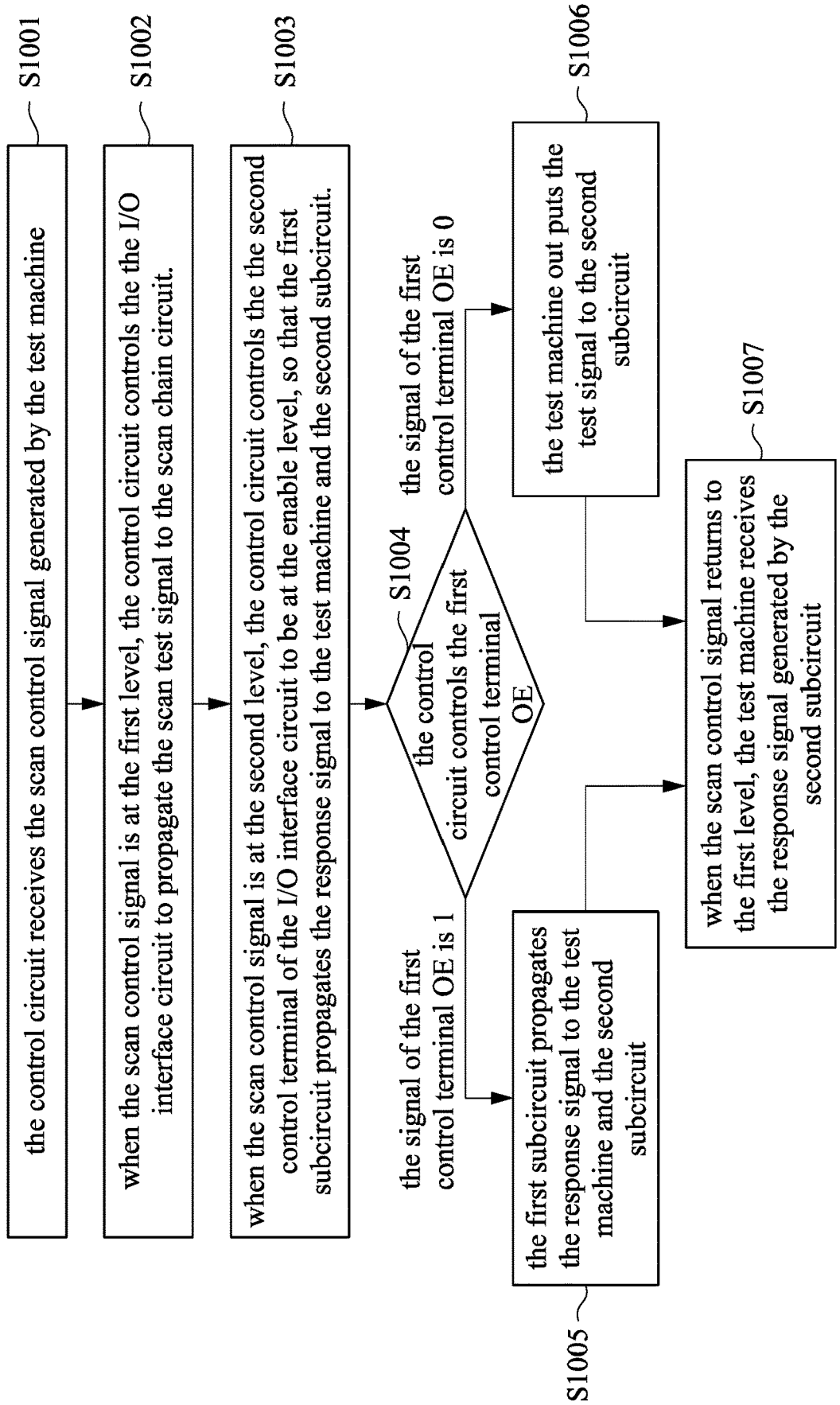
FIG. 10 is a flowchart illustrating the circuit testing method in some embodiments of the present disclosure.

Referring to FIG. 10, here describe the circuit testing method in the second and the third embodiments of the present disclosure. In the step S1001, the control circuit 310 receives the scan control signal SE generated and seeded from the test machine 200. In the step S1002, when the scan control signal SE is at the first level, the control circuit 310 controls the I/O interface circuit 320 to propagate the scan test signal Sc1 to the scan chain circuit 330. In the step S1003, when the scan control signal SE is at the second level, the control circuit 310 sets the control terminal OE of the second input and output unit 320B and the third input and output unit 320C to the enable level through the second control signal S2 and the third control signal S3, so that the first subcircuit 340A may propagate the first response signal Sr1 to the test machine and the second subcircuit 340E via the loopback paths of the second input and output unit 320B or and the third input and output unit 320C.

In the step S1004, the control circuit 310 outputs the first control signal S1 to control the first control terminal OE. In the second embodiment of the present disclosure, as shown in step S1005, the output signal of the control circuit 310 (i.e., the first control signal) is at the enable level. At this time, the first subcircuit 340A outputs the first response signal Sr1 to the test machine 200 and the second subcircuit 340B via its related I/O loopback path. The test machine 200 determine whether the operation of the first subcircuit 340A and the internal circuit of the first input and output unit 310A is correct according to first response signal Sr1. Next, in the step S1007, when the scan control signal SE returns to the first level, the test machine 200 indirectly receives the second response signal Sr2 propagated from the second subcircuit 340B through the register in the scan chain in order to determine whether the operation of the second subcircuit 340B and the internal circuit of the first input and output unit 310A is correct.

In the third embodiment of the present disclosure, as shown in step S1006, the output signal of the control circuit 310 (i.e., the first control signal) is at the disable level. At this time, the test machine 200 generates and sends the first test signal St1 to the second subcircuit 340B through the first output terminal O. Next, in the step S1007, when the scan control signal SE returns to the first level, the test machine 200 indirectly receives the second response signal Sr2 propagated from the second subcircuit 3408 through the register in the scan chain in order to determine whether the operation of the second subcircuit 3206 is correct.

According to three embodiments of the present disclosure, the testing coverage of the circuit testing system in different embodiments are shown in Table 2 below:

TABLE 2

| The first embodiment (corresponding to FIG. 3) | The scan chain circuit 130, the first input and output unit 120A, the second input and output unit 120B, the third input and output unit 120C, the first subcircuit 140A, the second subcircuit 140B, the logic circuit 112 |
| --- | --- |
| The second embodiment (corresponding to FIG. 7) | The scan chain circuit 330, the first input and output unit 320A, the second input and output unit 320B, the third input and output unit 320C, the first subcircuit 340A, the second subcircuit 340B |
| The third embodiment (corresponding to FIG. 8) | The scan chain circuit 330, the second input and output unit 320B, the third input and output unit 320C, the first subcircuit 340A, the second subcircuit 340B, wherein the testing of the first subcircuit 340A and second subcircuit 340B are possibly incomplete. |

In addition, for the convenience of those skilled in the art, the technical manner of three embodiments of the present disclosure are shown in Table 3 below:

TABLE 3

| | first embodiment (corresponding to FIG. 3) | second embodiment (corresponding to FIG. 7) | third embodiment (corresponding to FIG. 8) |
| --- | --- | --- | --- |
| need scanning auxiliary signal | Yes | No | No |
| The internal circuit operation of the first input and output unit | Do not need the lookback path. Set to the input state in the beginning of the capture mode, then decide to be at the input or output states according to the output signal of the logic circuit 112 | the output in the capture mode, so that the first response signal Sr1 is propagated to the second subcircuit 340B through its I/O loopback path | Always maintain to the input state |
| The internal circuit operation of the second input and output | Do not need the lookback path. Set to the input state in the beginning of the capture mode, then decide to be at the input or output states according to the output signal of the logic circuit 112 | Actively limit to the output state in the capture mode, so that the first response signal Sr1 is propagated to the second subcircuit 340B through its I/O loopback path | Limited to the output state in the capture mode, so that the first response signal Sr1 is propagated to the second subcircuit 340B through its I/O loopback path |
| The internal circuit operation of the third input and output | Do not need the lookback path. Set to the input state in the beginning of the capture mode, then decide to be at the input or output states according to the output signal of | Actively limit to the output state in the capture mode, so that the first response signal Sr1 is propagated to the second subcircuit 340B through its I/O loopback path | Limited to the output state in the capture mode, so that the first response signal Sr1 is propagated to the second subcircuit 340B through its I/O loopback path |

TABLE 3-continued

| | first embodiment (corresponding to FIG. 3) | second embodiment (corresponding to FIG. 7) | third embodiment (corresponding to FIG. 8) |
|---|---|---|---|
| Need turnaround time | the logic circuit 112 Yes, T1 & T2 | Yes, T3 | No |

In addition, in the foregoing embodiments, the input and output units 120A-120C and 320A-320C are bi-directional I/O cells, but are not limited thereto. Part of the input and output units 120A-120C and 320A-320C may be a pure input interface circuit or a pure output interface circuit.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:

1. A circuit testing system, comprising:
a control circuit electrically connected to a test machine, and configured to receive a scan control signal; and
an I/O interface circuit electrically connected to the control circuit, the test machine, a scan chain circuit and a circuit under test, wherein an input terminal or an output terminal of the circuit under test is not connected to the scan chain circuit, when the scan control signal is at a first level, the control circuit is configured to control the I/O interface circuit to conduct the scan chain circuit to the test machine;
when the scan control signal is at a second level, the control circuit is configured to control the I/O interface circuit to conduct the circuit under test to the test machine so as to propagate a response signal generated by the circuit under test to the test machine.

2. The circuit testing system of claim 1, wherein the I/O interface circuit further comprises:
a first input and output unit configured to receive a scan test signal when the scan control signal is at a first level; and
a second input and output unit configured to propagate a scan response signal generated by the scan chain circuit to the test machine.

3. The circuit testing system of claim 2, wherein when the scan control signal is at the second level, the second input and output unit propagates the response signal generated by the circuit under test to the test machine.

4. The circuit testing system of claim 2, wherein when the scan control signal is at the second level, the first input and output unit propagates the response signal generated by the circuit under test to the test machine.

5. The circuit testing system of claim 2, wherein the first input and output unit comprises a first control terminal, a first testing terminal and a first output terminal; the first control terminal is electrically connected to the control circuit, the first testing terminal is electrically connected to the test machine, the first output terminal is electrically connected to the scan chain circuit;
wherein the second input and output unit comprises a second control terminal, a second testing terminal and a second input terminal; the second control terminal is electrically connected to the control circuit, the second testing terminal is electrically connected to the test machine, the second input terminal is electrically connected to the scan chain circuit.

6. The circuit testing system of claim 5, wherein the circuit under test comprises a first subcircuit, the first subcircuit is electrically connected to the second input terminal of the second input and output unit; when the scan control signal is at the second level, the first subcircuit outputs a first response signal to the test machine through the second input terminal.

7. The circuit testing system of claim 6, wherein the circuit under test comprises a second subcircuit, the second subcircuit is electrically connected to a second output terminal of the second input and output unit; when the scan control signal is at the second level, the first response signal is propagated to the second subcircuit through the second input terminal of the second input and output unit and the second output terminal of the second input and output unit; when the scan control signal is at the first level, the second subcircuit further propagates a second response signal to the test machine through the scan chain circuit and the second input and output unit.

8. The circuit testing system of claim 6, wherein the circuit under test comprises a second subcircuit, the second subcircuit is electrically connected to the first output terminal of the first input and output unit; when the scan control signal is at the second level, the test machine sends a first test signal to the second subcircuit through the first input and output unit, and the second subcircuit outputs a second response signal to the scan chain circuit; when the scan control signal is at the first level, the second response signal is propagated to the test machine through the second input and output unit.

9. The circuit testing system of claim 5, wherein the circuit under test comprises a first subcircuit, the first subcircuit is electrically connected to a first input terminal of the first input and output unit; when the scan control signal is at the second level, the first subcircuit outputs a first response signal to the test machine through the first input terminal.

10. The circuit testing system of claim 9, wherein the circuit under test comprises a second subcircuit, the second subcircuit is electrically connected to the first output terminal; when the scan control signal is at the second level, the first input and output unit is further configured to propagate a first test signal to the second subcircuit.

11. The circuit testing system of claim 10, wherein when the scan control signal changes from the second level to the first level, the test machine outputs the scan test signal to the first input and output unit after a turnaround time.

12. The circuit testing system of claim 5, wherein the circuit under test comprises a second subcircuit, the second subcircuit is electrically connected to the first output terminal of the first input and output unit, when the scan control signal is at the second level, the test machine sends a first test signal to the second subcircuit through the first input and output unit.

13. A circuit testing method, comprising:
receiving a scan control signal from a test machine by a control circuit;
controlling, by the control circuit, an I/O interface circuit to conduct the test machine to a scan chain circuit when the scan control signal is at a first level in order to propagate a scan test signal send from the test machine to the scan chain circuit; and controlling, by the control circuit, the I/O interface circuit to conduct a circuit under test to the test machine when the scan control signal is at a second level in order to propagate a response signal generated by the circuit under test to the test machine wherein an input terminal or an output terminal of the circuit under test is not connected to the scan chain circuit.

14. The circuit testing method of claim 13, wherein when the scan control signal is at the first level, receiving the scan test signal through a first input and output unit of the I/O interface circuit; when the scan control signal is at the first level, propagating a scan response signal generated by the scan chain circuit to the test machine through a second input and output unit of the I/O interface circuit.

15. The circuit testing method of claim 14, wherein the circuit under test comprises a first subcircuit, the first subcircuit is electrically connected to a second input terminal of the second input and output unit; the circuit testing method further comprises:
outputing, by the first subcircuit, a first response signal to the test machine through the second input and output unit when the scan control signal is at the second level.

16. The circuit testing method of claim 15, wherein the circuit under test comprises a second subcircuit, the second subcircuit is electrically connected to a second output terminal of the second input and output unit; the circuit testing method further comprises:
propagating the first response signal to the second subcircuit through the second input terminal of the second input and output unit and the second output terminal of the second input and output unit when the scan control signal is at the second level; and
propagating a second response signal to the test machine through the scan chain circuit and the second input and output unit when the scan control signal is at the first level.

17. The circuit testing method of claim 14, wherein the circuit under test comprises a first subcircuit, the first subcircuit is electrically connected to a first input terminal of the first input and output unit; the circuit testing method further comprises:
outputing, by the first subcircuit, a first response signal to the test machine through the first input and output unit when the scan control signal is at the second level.

18. The circuit testing method of claim 17, wherein the circuit under test comprises a second subcircuit, the second subcircuit is electrically connected to a first output terminal of the first input and output unit, and the circuit testing method further comprises:
propagating a first test signal to the second subcircuit when the scan control signal is at the second level; and
outputting, by the test machine, the scan test signal to the first input and output unit after a turnaround time when the scan control signal changes from the second level to the first level.

19. The circuit testing method of claim 14, wherein the circuit under test comprises a second subcircuit, the second subcircuit is electrically connected to a first output terminal of the first input and output unit, and the circuit testing method further comprises:
outputing, by the test machine, a first test signal to the second subcircuit through the first input and output unit when the scan control signal is at the second level.

20. The circuit testing method of claim 14, wherein the circuit under test comprises a first subcircuit and a second subcircuit, the first subcircuit is electrically connected to a second input terminal of the second input and output unit, the second subcircuit is electrically connected to a second output terminal of the second input and output unit, and the circuit testing method further comprises:
propagating a first response signal to the second input and output unit through the first subcircuit when the scan control signal is at the second level;
using the received first response signal as a second test signal; and
propagating the second test signal to the second subcircuit.

* * * * *